(12) United States Patent
Kim et al.

(10) Patent No.: US 11,296,038 B2
(45) Date of Patent: Apr. 5, 2022

(54) PRECISION STRUCTURED GLASS ARTICLE HAVING EMI SHIELDING AND METHODS FOR MAKING THE SAME

(71) Applicant: CORNING INCORPORATED, Corning, NY (US)

(72) Inventors: Jin Su Kim, Seoul (KR); Dean Michael Thelen, Addison, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 17/043,567

(22) PCT Filed: Apr. 3, 2019

(86) PCT No.: PCT/US2019/025525
§ 371 (c)(1),
(2) Date: Sep. 29, 2020

(87) PCT Pub. No.: WO2019/195385
PCT Pub. Date: Oct. 10, 2019

(65) Prior Publication Data
US 2021/0125938 A1    Apr. 29, 2021

Related U.S. Application Data

(60) Provisional application No. 62/652,265, filed on Apr. 3, 2018.

(51) Int. Cl.
*H01L 21/00* (2006.01)
*H01L 23/552* (2006.01)
*H01L 21/48* (2006.01)

(52) U.S. Cl.
CPC .......... *H01L 23/552* (2013.01); *H01L 21/481* (2013.01); *H01L 21/4814* (2013.01)

(58) Field of Classification Search
None
See application file for complete search history.

(56) References Cited

U.S. PATENT DOCUMENTS

| 4,130,680 | A  | 12/1978 | Ference et al. |
| 7,764,514 | B2 | 7/2010  | Mongia et al.  |

(Continued)

FOREIGN PATENT DOCUMENTS

| GB | 2315266 A     | 1/1998 |
| JP | 2000-178036 A | 6/2000 |
| WO | 2019/023213 A1 | 1/2019 |

OTHER PUBLICATIONS

Buch et al.; "Design and Demonstration of Highly Miniaturized Low Cost Panel Level Glass Package for MEMS Sensors"; 2017 IEEE 67th Electronic Components and Technology Conference; 10 Pages.

(Continued)

*Primary Examiner* — Reema Patel

(57) ABSTRACT

Structured glass articles include a glass substrate including a glass cladding layer fused to a glass core layer, a cavity formed in the glass substrate, and a shielding layer disposed within the cavity. In some embodiments, a passivation layer is disposed within the cavity such that the shielding layer is between the passivation layer and the glass substrate. A method for forming a glass fan-out includes depositing a shielding layer within a cavity in a glass substrate. The glass substrate includes a glass cladding layer fused to a glass core layer. A silicon chip may be deposited within the cavity. In some embodiments, the method also includes depositing a passivation layer within the cavity such that the shielding layer is between the passivation layer and the glass substrate.

20 Claims, 5 Drawing Sheets

(56) References Cited

U.S. PATENT DOCUMENTS

| | | | |
|---|---|---|---|
| 9,236,355 B2 | 1/2016 | Zhai et al. |
| 9,340,451 B2 | 5/2016 | Boek et al. |
| 9,391,041 B2 | 7/2016 | Lin |
| 9,711,465 B2 | 7/2017 | Liao et al. |
| 2008/0310114 A1 | 12/2008 | Pawlenko et al. |
| 2009/0091888 A1 | 4/2009 | Lin et al. |
| 2012/0061135 A1 | 3/2012 | Hill et al. |
| 2012/0241209 A1 | 9/2012 | Wu |
| 2012/0243199 A1 | 9/2012 | Wu |
| 2013/0032916 A1 | 2/2013 | Lin et al. |
| 2014/0062607 A1 | 3/2014 | Nair et al. |
| 2015/0085462 A1 | 3/2015 | Okamoto |
| 2016/0194235 A1 | 7/2016 | Hart et al. |
| 2017/0073266 A1 | 3/2017 | Amosov et al. |
| 2017/0278766 A1 | 9/2017 | Kim et al. |
| 2020/0235020 A1 | 7/2020 | Dohn et al. |

OTHER PUBLICATIONS

International Search Report and Written Opinion of the International Searching Authority; PCT/US2019/025525; dated Jun. 24, 2019; 9 Pages; Commissioner for Patents.

Microwaves101.com, "Microstrip", Available Online at <https://web.archive.org/web/20200815082606/https://www.microwaves101.com/encyclopedias/microstrip>, retrieved on Aug. 15, 2020, 4 pages.

Microwaves101.com, "Stripline", Available Online at <https://www.microwaves101.com/encyclopedias/stripline>, Sep. 2018, 4 pages.

US 11,296,038 B2

PRECISION STRUCTURED GLASS ARTICLE HAVING EMI SHIELDING AND METHODS FOR MAKING THE SAME

CROSS-REFERENCE TO RELATED APPLICATIONS

This application claims the benefit of priority under 35 U.S.C. § 371 of International Application No. PCT/US2019/025525, filed on Apr. 3, 2019, which claims the benefit of priority under 35 U.S.C. § 119 of U.S. Provisional Application No. 62/652,265, filed Apr. 3, 2018, the content of each of which is incorporated herein by reference in its entirety.

BACKGROUND

Field

This disclosure relates to precision structured glass articles having EMI shielding and methods for making the same. In addition, this disclosure relates to integrated circuit packages, optical devices, and microfluidic devices comprising the precision structured glass articles having EMI shielding.

Technical Background

Structured glass articles can have cavities or channels that can be useful for a variety of applications, including, by way of example and not limitation, integrated circuit packages, optical encapsulation, and microfluidic devices. Heterogeneous integration of microelectronic components (e.g., chips, antennas, and sensors) is an effective way to utilize high density packaging formed from structured glass articles. However, non-negligible electromagnetic interference (EMI) may be introduced by the various operating conditions of the microelectronic components. Additionally or alternatively, a high density of microelectronic components may generate a large amount of heat.

SUMMARY

Disclosed herein are precision structured glass articles having EMI shielding and methods for making the same. Such structured glass articles can be used for integrated circuit packages, optical devices, and microfluidic devices.

Disclosed herein is a structured glass article comprising a glass substrate comprising a glass cladding layer fused to a glass core layer, a cavity formed in the glass substrate, and a shielding layer disposed within the cavity.

Disclosed herein is a method for forming a glass fan-out, the method comprising depositing a shielding layer within a cavity in a glass substrate. The glass substrate includes a glass cladding layer fused to a glass core layer. A silicon chip may be deposited within the cavity.

It is to be understood that both the foregoing general description and the following detailed description are merely exemplary, and are intended to provide an overview or framework to understanding the nature and character of the claimed subject matter. The accompanying drawings are included to provide a further understanding and are incorporated in and constitute a part of this specification. The drawings illustrate one or more embodiment(s), and together with the description, serve to explain principles and operation of the various embodiments.

DETAILED DESCRIPTION

Figure 1:
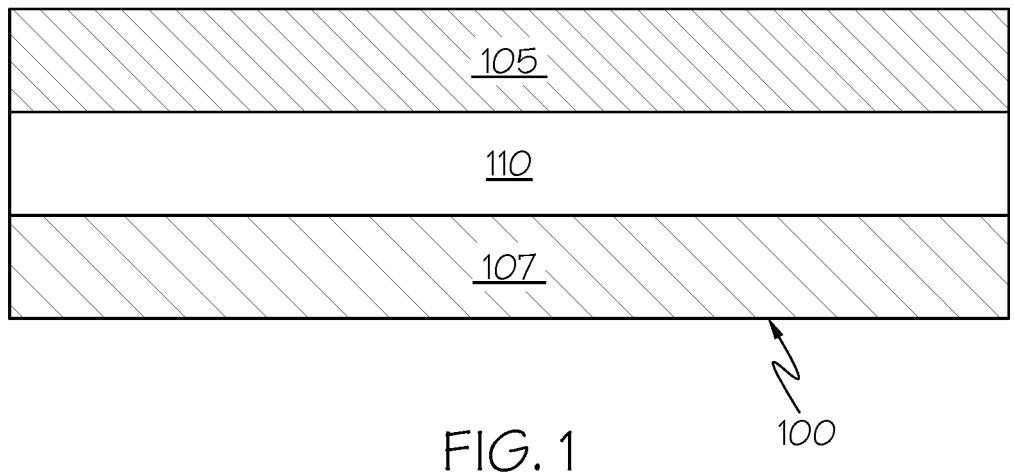
FIG. 1 is a cross-sectional schematic view of a glass substrate in accordance with one or more embodiments shown and described herein.

Reference will now be made in detail to various embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

In various embodiments, a structured glass article includes a glass substrate and a cavity formed in the glass substrate. In some embodiments, the glass substrate includes a glass cladding layer fused to a glass core layer. In various embodiments, the cavity is formed in the glass cladding layer. In some embodiments, a shielding layer is disposed within the cavity. In some embodiments, a passivation layer is disposed within the cavity. In some such embodiments, the shielding layer is between the passivation layer and the glass substrate. In various embodiments, the shielding layer is disposed along at least one sidewall of the cavity. In some embodiments, the shielding layer may additionally be disposed on the floor of the cavity. Additionally, or alternatively, the shielding layer may be disposed on a face of the glass cladding layer between the cavity and an adjacent cavity in the glass substrate. In some embodiments, the shielding layer is deposited within a trench formed within the glass cladding layer.

In various embodiments, a method for forming a glass fan-out package includes depositing a shielding layer within a cavity in a glass substrate. In some embodiments, the glass substrate includes a glass cladding layer fused to a glass base layer. In some embodiments, the method further includes depositing a silicon chip within the cavity. In some such embodiments, the method may further include depositing a passivation layer within the cavity. The passivation layer may be deposited after depositing the shielding layer. In some of these embodiments, the passivation layer may be deposited prior to depositing the silicon chip within the cavity. However, in some other of these embodiments, the passivation layer may be deposited after the silicon chip is deposited within the cavity. In some embodiments, the shielding layer may be removed along a floor of the cavity prior to depositing the silicon chip within the cavity.

Figure 8:
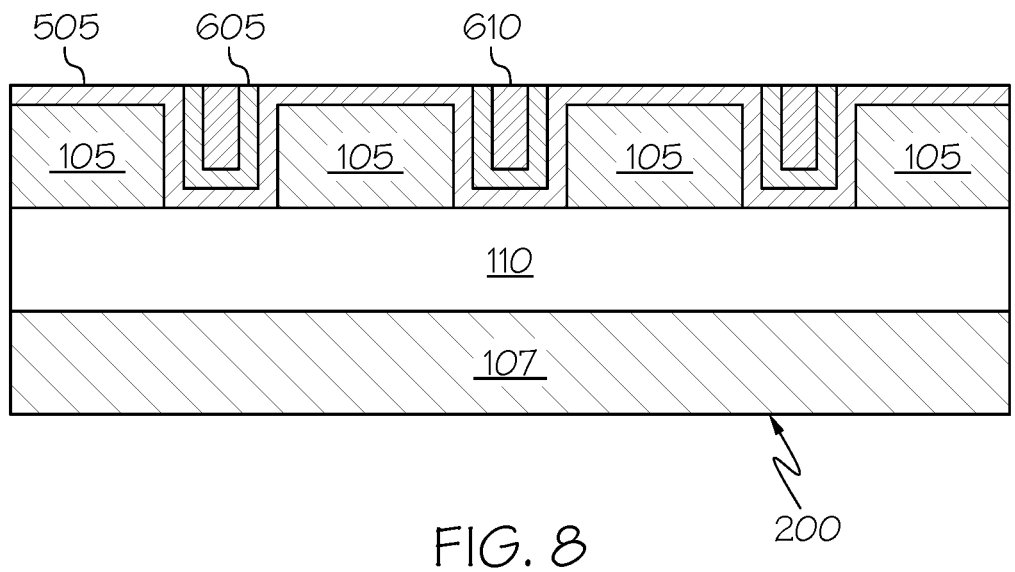
FIG. 8 is a cross-sectional schematic view of an embodiment of a reconstituted wafer- and/or panel-level package having a shielding layer and passivation layer deposited along sidewalls and floors of the cavities and having the shielding layer deposited along a top surface of the glass substrate in accordance with one or more embodiments shown and described herein.

In some embodiments, an integrated circuit package includes a structured glass article as described herein. For example, the integrated circuit package includes a microelectronic device (e.g., an integrated circuit chip) positioned in each of the one or more cavities of the structured glass article. Such an integrated circuit package can benefit from the EMI shielding and cooling as described herein. For example, such EMI shielding may improve the functionality of the integrated circuit package formed from the structured glass article by reducing or even eliminating the electromagnetic interference between different microelectronic components provided therein. Additionally or alternatively, by thermally interconnecting the shielding layer deposited in various cavities (as shown in FIG. 8), improved cooling efficiency can be realized. Cooling efficiency can also be improved by thermally connecting the shielding layer to the redistribution layer (RDL).

Integrated circuit (IC) packaging is the back-end process of semiconductor device fabrication, in which the block of semiconducting material is packaged in a supporting case that provides an electrical connection from the chip density to the printed circuit board density and prevents physical damage and corrosion to the semiconducting material. The case, known as a "package," supports the electrical contacts which connect the device to a circuit board. This process is often referred to as packaging, but also can be referred to as semiconductor device assembly, encapsulation, or sealing.

Wafer-level packaging or wafer-level chip-scale packaging (WLP) is the technology of packaging an IC (e.g., chips or dies) while still part of the wafer, in contrast to the more conventional method of slicing the wafer into individual circuits (dicing) and then packaging them. WLP can enable integration of wafer fabrication, packaging, testing, and burn-in at the wafer-level to streamline the manufacturing process undergone by a device from silicon start to customer shipment. WLP can include extending the wafer fabrication processes to include device interconnection and device protection processes. Most other kinds of packaging processes do wafer dicing first, and then put the individual die in a plastic package and attach the solder bumps. WLP involves attaching the top and bottom outer layers of packaging and the solder bumps to ICs while still in the wafer and then dicing the wafer.

One type of WLP is fan-in (FI), which has all the contact terminals within the footprint of the die. Such a configuration can pose a significant limitation when adjusting the layout of the contact terminals to match the design of the next-level substrate. Fan-out (FO) is another type of WLP that represents a compromise between die-level packaging and FI WLP. FO WLP involves dicing the semiconductor wafer and then embedding the singularized ICs in a reconstituted or artificial molded wafer. The dies are separated from each other on the reconstituted wafer by a distance that is large enough to allow the desired FO redistribution layer (RDL) to be manufactured using standard WLP processes. The FO WLP provides a way to connect the smaller die with fine lead pitch to the larger lead pitch of a printed circuit board.

Although the use of glass structures in FO WLP has many advantages such as low cost, package size reduction, and fine lead pitch, the compact package footprint may introduce non-negligible electromagnetic interferences (EMI) as a result of different operational parameters of various microelectronics within the FO WLP. Additionally, the high density of microelectronics in the package may generate a large amount of heat. The EMI and/or the heat may adversely impact the operation of the microelectronics. The thermal and/or EMI effects can be mitigated by using the structured glass article including EMI shielding and cooling described herein as the package.

FIG. 1 is a cross-sectional schematic view of some embodiments of a glass substrate 100. Glass substrate 100 includes a glass core layer 110 coupled to a first or upper glass cladding layer 105 and a second or lower glass cladding layer 107. The glass substrate 100 includes multiple glass layers and can be considered a glass laminate. In some embodiments, the layers 105, 107, 110 are fused together without any adhesives, polymer layers, coating layers or the like positioned between them. In other embodiments, the layers 105, 107, 110 are coupled (e.g., adhered) together using adhesives or the like.

Glass substrate 100 can have any suitable composition and be made using any suitable method. Examples of suitable glass compositions can include alkaline-earth aluminoborosilicate glasses, zinc borosilicate glasses, and soda-lime glass as well as glass ceramics, such as those enriched with magnesium oxide, yttria, beryllia, alumina, or zirconia. In general, glass substrate 100 and any of the layers 105, 107, 110 in the glass substrate can have any of the compositions or be made using any of the methods disclosed in U.S. Pat. No. 9,340,451 entitled "Machining of Fusion-Drawn Glass Laminate Structures Containing a Photomachinable Layer," issued May 17, 2016, and U.S. Patent Application Publication No. 2017/0073266 entitled "Glass Article and Method for Forming the Same," published Mar. 16, 2017, each of which is hereby incorporated by reference in its entirety.

The glass substrate 100 is configured so that at least one of the glass cladding layers 105, 107 and the glass core layer 110 have different physical dimensions and/or physical properties that allow for selective removal of the at least one glass cladding layer 105, 107 relative to the glass core layer 110 to form precisely dimensioned cavities 425, which can be sized and shaped to receive microelectronic components, receive an optically active object, and/or function as microfluidic channels.

One aspect of the glass substrate 100 that can vary widely is the thickness of the layers 105, 107, 110. For example, the layers 105, 107, 110 can all have the same thickness or different thicknesses or two of the layers can be the same thickness while the third layer has a different thickness. In some embodiments, one or both of the glass cladding layers 105, 107 may have a thickness that is the same or substantially the same as the thickness of a microelectronic component being packaged. Additionally, or alternatively, one or both of the glass cladding layers 105, 107 may have a thickness that is precisely sized for microfluidic flow.

In some embodiments, one or both of the glass cladding layers 105, 107 are approximately 70 microns to approximately 400 microns thick or approximately 100 microns to approximately 300 microns thick. In other embodiments, one or both of the cladding layers 105, 107 are at least approximately 70 microns thick or at least approximately 100 microns thick. In other embodiments, one or both of the cladding layers 105, 107 are no more than 400 microns thick or no more than 300 microns thick. These thicknesses generally correspond to the thickness of microelectronic components that commonly undergo FO WLP processing. It should be appreciated, however, that the glass cladding layers 105, 107 can have other thicknesses, particularly, when used with microelectronic components having smaller or larger thicknesses than those disclosed.

Another aspect of the glass substrate 100 that can vary widely is the glass composition of the layers 105, 107, 110. For example, the layers 105, 107, 110 can all have the same glass composition or different glass compositions or two of the layers can have the same glass composition while the third layer has a different glass composition. In general, one or both of the glass cladding layers 105, 107 have a glass composition that is different than the glass composition of the glass core layer 110. This provides the glass cladding layers 105, 107 certain properties that make them suitable to the formation of the cavities 425.

In some embodiments, the glass compositions of the layers 105, 107, 110 can vary such that the durability of the layers 105, 107, 110 in an etchant varies. For example, in embodiments, one or both of the glass cladding layers 105, 107 can have a dissolution rate in the etchant that is different than the glass core layer 110. The different durability between the layers 105, 107, 110 makes it possible to form the cavities 425 in the surface of the glass substrate 100. For example, the glass cladding layers 105, 107 can have a sufficiently high dissolution rate in the etchant that they can be etched to form the cavities 425. On the other hand, the glass core layer 110 can have a sufficiently low dissolution rate in the etchant that it is not substantially susceptible to being etched. Thus, the glass core layer 110 can act as an etch stop to limit the depth to which the glass substrate 100 can be etched using the etchant.

In some embodiments, one or both of the glass cladding layers 105, 107 have a dissolution rate in the etchant that is greater than the dissolution rate of the glass core layer 110. For example, the glass core layer 110 can have a dissolution rate in the etchant that is zero or sufficiently close to zero that it is insusceptible to being etched to any significant extent.

In some embodiments, the glass compositions of the layers 105, 107, 110 can vary such that the photosensitivity of the layers 105, 107, 110 varies. For example, in embodiments, one or both of the glass cladding layers 105, 107 can have a photosensitivity that is different than the glass core layer 110. The different photosensitivity between the layers 105, 107, 110 makes it possible to form the cavities 425 in the surface of the glass substrate 100. For example, the glass cladding layers 105, 107 can be sufficiently photosensitive that they can be photomachined to form the cavities 425. For example, exposure of the glass cladding layers 105, 107 to a radiation source can alter the properties of the glass cladding layer 105, 107. On the other hand, the glass core layer 110 can be sufficiently non-photosensitive that it is not susceptible to being photomachined. For example, the properties of the glass core layer 110 can be substantially unaffected by exposure to the radiation source.

In some embodiments, one or both of the glass cladding layers 105, 107 have a photosensitivity that is greater than the photosensitivity of the glass core layer 110. For example, the glass core layer 110 can have a photosensitivity that is zero or sufficiently close to zero that it is not susceptible to being photomachined to any significant extent.

It should be appreciated that numerous changes can be made to the embodiments of the glass substrate 100 shown in FIG. 1. For example, in some embodiments, the glass substrate 100 can include only two glass layers 105, 110. In other embodiments, the glass substrate 100 can include four or more glass layers. Numerous other variations are also contemplated.

In some embodiments, cavities 425 are formed in the glass substrate 100 to transform the glass substrate into a structured article as described herein. The cavities 425 can be formed in the surface of the glass substrate 100 using the method depicted in FIG. 2. In some embodiments, the method includes forming a mask 215 on a surface of the glass substrate 100. For example, the mask 215 is formed on the surface of the glass cladding layer 105 and/or the glass cladding layer 107. The mask 215 can be formed by printing (e.g., inkjet printing, gravure printing, screen printing, or another printing process) or another deposition process. In some embodiments, the mask 215 is resistant to the etchant (e.g., the etchant that will be used to etch the cavities 425 in the glass substrate 100). For example, the mask 215 can include an acrylic ester, a multifunctional acrylate n-vinyl-caprolactam, or another suitable mask material. In some embodiments, the mask 215 is formed from an ink material comprising a primer to enhance adhesion between the mask and the glass substrate 100. Such enhanced adhesion can reduce seepage of the etchant between the mask 215 and the glass substrate 100, which can help to enable the precise cavities described herein.

In some embodiments, the mask 215 includes one or more open regions at which the glass substrate 100 remains uncovered. The open regions of the mask 215 can have a pattern corresponding to the desired pattern of the cavities 245 to be formed in the glass substrate 100. For example, the pattern of the mask 215 can be an array of regularly repeating rectangular shapes (e.g., to receive microelectronic components as described herein). In such embodiments, the shapes patterned by the mask 215 can correspond closely to the shape of the microelectronic components. Other shapes also can be used, and the shapes can correspond closely to the shape of the microelectronic component or be capable of securely holding the microelectronic component in position on the glass substrate 100. Thus, the mask 215 can be configured as an etch mask to enable selective etching of the glass cladding layer 105 and/or the glass cladding layer 107 and form the cavities 425 in the glass substrate 100 as described herein.

Figure 2:
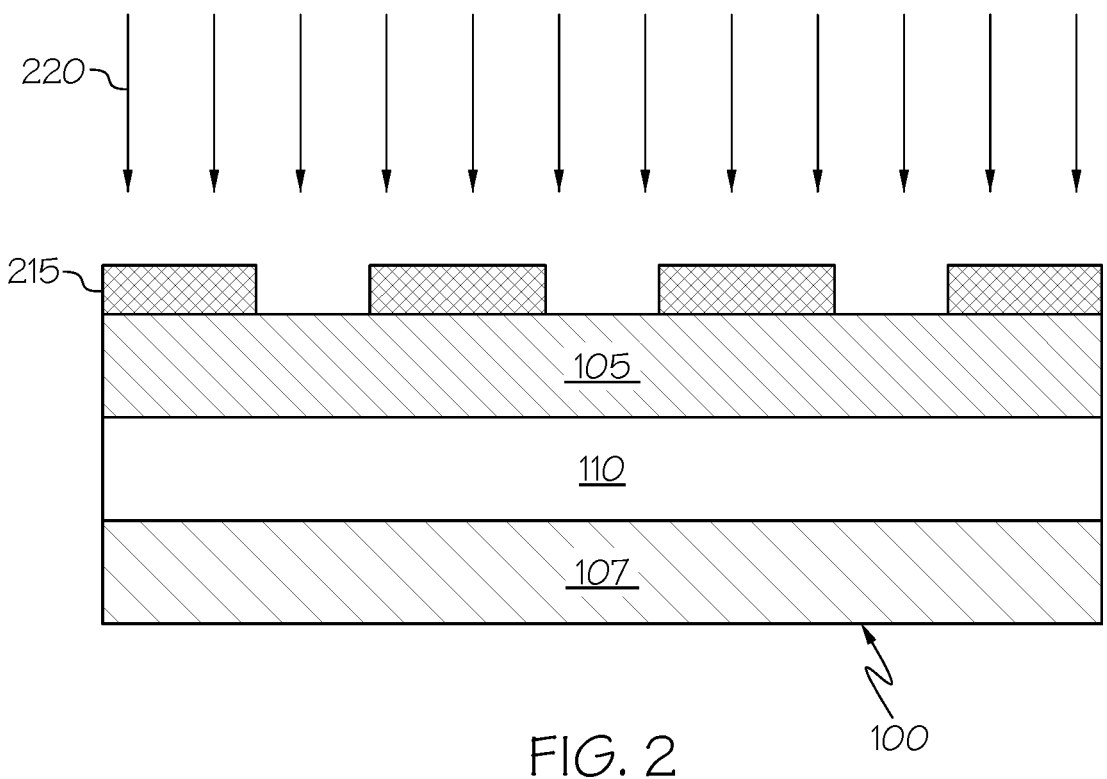
FIG. 2 is a cross-sectional schematic view of the glass substrate in FIG. 1 as it is selectively exposed to an etchant through a mask to form cavities in a cladding layer in accordance with one or more embodiments shown and described herein.

In some embodiments, the glass substrate 100 with the mask 215 disposed thereon is exposed to the etchant 220. For example, the glass cladding layer 105 and/or the glass cladding layer 107 is contacted with the etchant 220 as shown in FIG. 2, thereby selectively etching an exposed portion of the respective glass cladding layer that is uncovered by the mask 215 and forming the cavities 425 in the glass substrate, thereby transforming the substrate into the shaped article. Thus, following formation of the cavities 425, the glass substrate 100 can be referred to as the shaped article. In some embodiments, the glass substrate 100 with the mask 215 disposed thereon is exposed to the etchant 220 at an etching temperature and for an etching time. For example, the etching temperature is about 20° C., about 22° C., about 25° C., about 30° C., about 35° C., about 40° C., about 45° C., or about 50° C., or any ranges defined by any combination of the stated values. A lower etching temperature can help to maintain the integrity of the mask 215 during the etching, which can enable an increased etching time and/or improved cavity shape as described herein. Additionally, or alternatively, the etching time can be about 10 minutes, about 15 minutes, about 20 minutes, about 25 minutes, about 30 minutes, about 35 minutes, about 40 minutes, about 45 minutes, about 50 minutes, about 55 minutes, about 60 minutes, about 65 minutes, about 70 minutes, about 75 minutes, about 80 minutes, about 85 minutes, or about 90 minutes, or any ranges defined by any combination of the stated values. A relatively long etching time (e.g., an etching time of greater than 10 minutes) can enable substantially vertical sidewalls of the cavities 425 as described herein.

In some embodiments, the glass cladding layer 105 and/or the glass cladding layer 107 etch at least 1.5 times faster, at least 2 times faster, at least 5 times faster, at least 10 times faster, at least 20 times faster, or at least 100 times faster than the glass core layer 110. Additionally, or alternatively, a ratio of the etch rate of the glass cladding layer 105 and/or the glass cladding layer 107 to the etch rate of the glass core layer 110 is about 5, about 10, about 15, about 20, about 25, about 30, about 35, about 40, about 45, about 50, about 55, about 60, about 65, about 70, about 75, about 80, about 85, about 90, about 95, about 100, or any ranges defined by any combination of the stated values.

Figure 3:
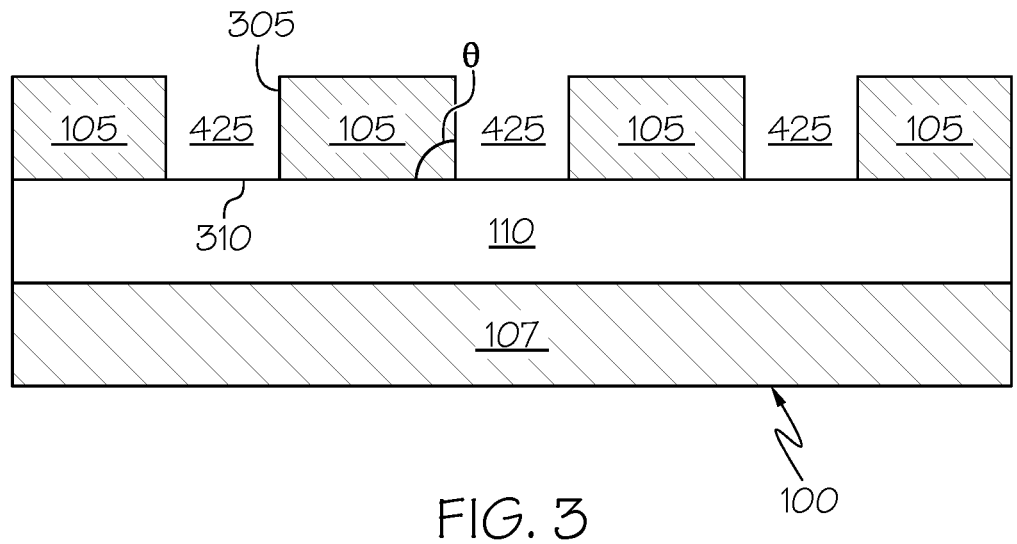
FIG. 3 is a cross-sectional schematic view of the glass substrate in FIGS. 1-2 after forming cavities therein and removing the mask in accordance with one or more embodiments shown and described herein.

In some embodiments, the forming the cavities 425 includes etching substantially entirely through the glass cladding layer 105 and/or the glass cladding layer 107 to expose a portion of the glass core layer 110 at the bottom of the cavities, as shown in FIG. 3. Thus, the sidewalls 305 of the cavities 425 are defined by the glass cladding layer 105 and/or the glass cladding layer 107, and the floors 310 of the cavities are defined by the glass core layer 110. In some embodiments, the glass core layer 110 is not substantially etched during the forming the cavities 425. Thus, the glass core layer 110 serves as an etch stop that determines the depth of the cavities 425.

In some embodiments, the floor 310 of each of the cavities 425 is of optical quality. For example, a surface roughness (Ra) of the floor 310 of each of the cavities 425 is at most about 50 nm, at most about 40 nm, at most about 30 nm, at most about 20 nm, at most about 10 nm, at most about 9 nm, at most about 8 nm, at most about 7 nm, at most about 6 nm, or at most about 5 nm. Such low surface roughness can be enabled by the etch stop provided by the glass core layer 110 and/or agitating the etchant during the etching to remove etching byproducts from each of the cavities 425. Additionally, or alternatively, such low surface roughness can enable light to pass through the floor 310 (e.g., for optical activation and/or analysis of an object or material disposed within the cavities) without substantial distortion.

In some embodiments, the floor 310 of each of the cavities 425 is substantially flat. For example, a difference between a first depth of the cavity 425 at a first position along the perimeter of the cavity 425 and a second depth of the cavity 425 at a second position along the perimeter of the cavity 425 opposite the first position (e.g., diametrically opposed) is at most about 5 µm, at most about 4 µm, at most about 3 µm, at most about 2 µm, at most about 1 µm, at most about 0.9 µm, at most about 0.8 µm, at most about 0.7 µm, at most about 0.6 µm, at most about 0.5 µm, at most about 0.4 µm, at most about 0.3 µm, at most about 0.2 µm, or at most about 0.1 µm. Such a low depth difference can be enabled by the etch stop provided by the glass core layer 110. For example, the depth of the cavity 425 can be determined primarily by the thickness t of the glass cladding layer 105 and/or the glass cladding layer 107 without changing substantially as a result of changes in etch temperature and/or etch time.

In some embodiments, the sidewalls 305 of the cavities 425 are substantially vertical. For example, an angle θ formed between the sidewall 305 and the floor 310 of the cavity 425 measured within the glass cladding is approximately 90°, or from about 85° to about 91°. However, in embodiments, the angle θ formed between the sidewall 305 and the floor 310 of the cavity 425 measured within the glass gladding (shown in FIG. 3) is from about 60° to about 90°. In some of such embodiments, the depth of the cavity is at least about 30 µm, at least about 40 µm, at least about 50 µm, at least about 60 µm, at least about 70 µm, at least about 80 µm, or at least about 90 µm. For example, the depth of the cavity can be from about 30 µm to about 210 µm, from about 40 µm to about 200 µm, from about 50 µm to about 150 µm. Such a low angle of the sidewalls can be enabled by an increased etching time, which can be enabled by the etch stop provided by the glass core layer 110. For example, the etching time can be extended to remove material at the intersection between the sidewalls and the floor near the bottom of the cavity without substantially increasing the depth of the cavity. Removing such material can result in a straighter (e.g., vertical) sidewall compared to conventional wet etching processes.

Figure 4:
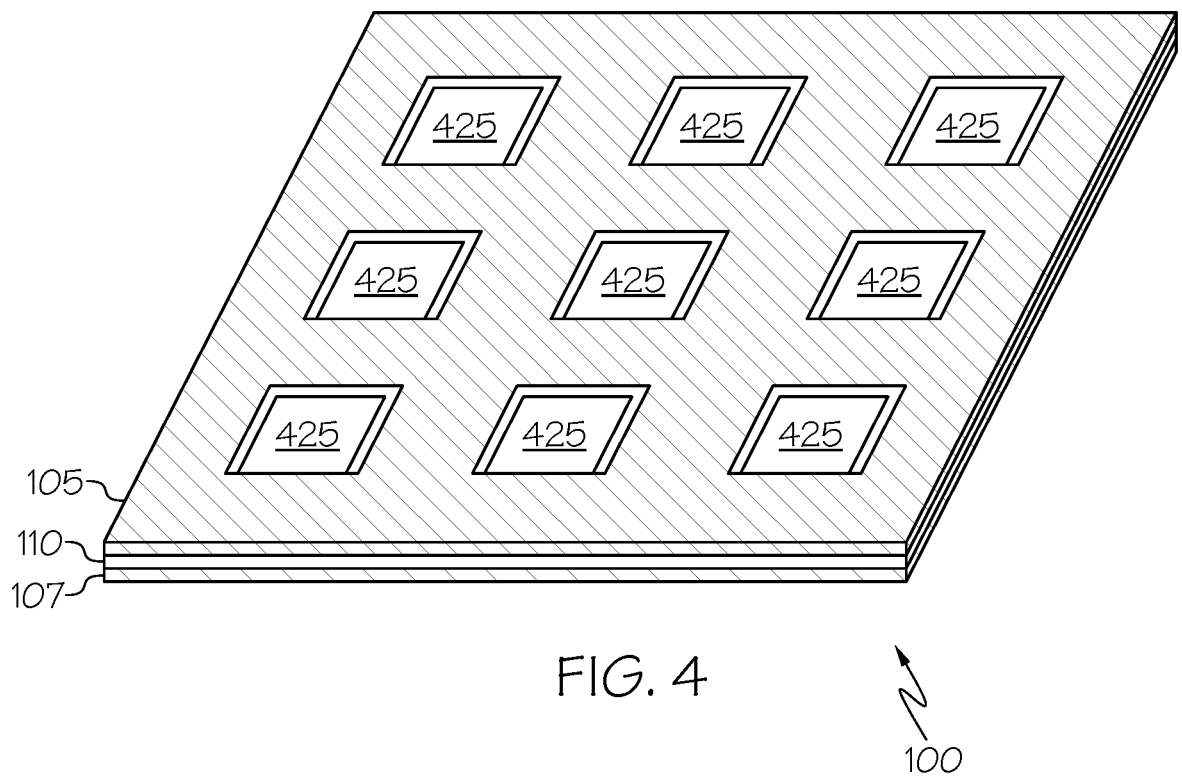
FIG. 4 is a perspective view, respectively, of the glass substrate in FIGS. 1-2 after forming cavities therein and removing the mask in accordance with one or more embodiments shown and described herein.

In some embodiments, following the forming the cavities 425, the mask 215 is removed from the glass substrate 100. For example, the removing the mask 215 includes contacting the mask with a solvent, thereby removing the mask from the surface of the glass substrate. In some embodiments, the solvent is water. For example, the removing the mask 215 includes submerging the glass substrate 100 with the mask 215 disposed thereon into water, thereby removing the mask from the surface of the glass substrate. FIGS. 3-4 are cross-sectional schematic and perspective views, respectively, of the glass substrate 100 with the cavities 425 formed therein and the mask 215 removed therefrom. Additional details on the formation of cavities 425 within the glass substrate 100 may be found in Patent Application No. 62/582,297, filed Nov. 6, 2017, and entitled "Precision Structured Glass Articles, Integrated Circuit Packages, Optical Devices, Microfluidic Devices, and Methods for Making the Same," which is incorporated by reference herein in its entirety.

Although embodiments are described herein with reference to using an etching process to form the cavities 425 in the glass substrate 100, it is contemplated that in some embodiments, the cavities 425 may be formed in the glass substrate 100 by a photomachining process. For example, a photomask may be applied to the surface of the cladding layer 105. The cladding layer 105 may then be exposed to a source of radiation through the photomask to pattern the cavities 425. Any suitable source of radiation can be used in the photomachining process, provided that it is capable of altering the properties of the glass cladding layer 105. For example, the source of radiation can be a UV lamp. In various embodiments, the glass cladding layer 105 is sufficiently photosensitive that the radiation changes its crystallinity properties, forming crystallized regions that are capable of being selectively removed by a physical and/or chemical procedure such as selective etching (e.g., wet etching). Details on such a process may be found in Patent Application No. 62/536,103, filed Jul. 24, 2017, and entitled "Reconstituted Wafer- and/or Panel-Level Packages and Methods for Making the Same," which is incorporated by reference herein in its entirety.

The cavities 425 shown in FIGS. 3-4 have a rectangular shape (as can be seen in FIG. 4) that corresponds to the shape of the microelectronic components 610. It should be appreciated, however, that the cavities 425 can have any suitable shape, and can vary depending on the particular microelectronic component to be fixed therein. For example, the cavities 425 can have a square shape, a circular shape, or any other polygonal or non-polygonal shape.

Figure 5:
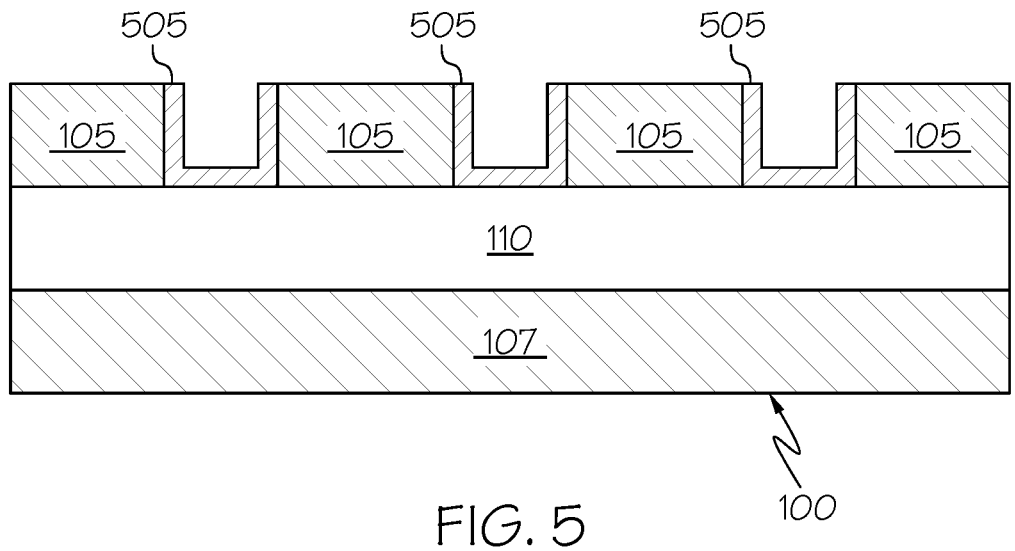
FIG. 5 is a cross-sectional schematic view of an embodiment of the glass substrate in FIGS. 1-3 with a shielding layer deposited along the sidewalls and floors of the cavities in accordance with one or more embodiments shown and described herein.

Turning now to FIG. 5, in various embodiments, a shielding layer 505 is deposited within one or more of the cavities 425 in the glass substrate 100. The shielding layer 505 can have any suitable composition and be made using any suitable method. Examples of suitable shielding layer compositions include any type of conductive material, including, but not limited to graphene and metals such as titanium, copper, aluminum, nickel, iron, and combinations thereof. For example, the shielding layer may be a layer of NiFe, graphene, titanium, aluminum, or copper. In various embodiments, the shielding layer is a material that adheres to glass, although in some embodiments, a combination of materials may be used that includes at least one material that does not readily adhere to glass. For example, in some embodiments, the shielding layer may include an adhesion promoter. In one particular embodiment, the shielding layer includes a seed layer of titanium deposited on the glass substrate and a layer of copper deposited over the seed layer.

The shielding layer 505 can be deposited according to any suitable method. Suitable methods include, by way of example and not limitation, chemical vapor deposition (CVD), physical vapor deposition (PVD), sputtering, or the like. The method may vary depending on the particular embodiment.

In various embodiments, the shielding layer 505 has a thickness that depends on the particular application. In particular, the EMI shielding effect depends on the conductivity of the materials and the electric field frequency. Specifically, at low frequencies, the penetrating depth of the electric field is large, and a thick layer is needed to shield EMI. In contrast, at high frequencies, a thinner layer may be used because the penetrating depth of the electric field is lower. However, since higher frequency shielding is confined near the surface of the conductor, more heat is generated because of surface resistance.

Accordingly, in various embodiments, the shielding layer 505 has a thickness of from about 3 times to about 5 times the maximum skin depth, $\delta_{max}$, of the material forming the shielding layer. The skin depth, $\delta_{max}$, refers to the depth below the surface of the conductor (e.g., the shielding layer 505) at which the current density has fallen to 1/e of the current density value at the surface, $J_S$. Skin depth, $\delta_{max}$, is represented by the formula:

$$\delta_{max} = \sqrt{\frac{2\rho}{\omega_{min}\mu}} \sqrt{\sqrt{1 + (\rho\omega_{min}\epsilon)^2} + \rho\omega_{min}\epsilon}$$

where $\rho$ is the resistivity of the conductor, $\omega_{min}$ is the minimum angular frequency of the current, $\mu$ is $\mu_r\mu_0$, $\epsilon$ is $\epsilon_r\epsilon_0$, $\mu_r$ is the relative magnetic permeability of the conductor, $\mu_0$ is the permeability of free space, $\epsilon_r$ is the relative permittivity of the material, and $\epsilon_0$ is the permittivity of free space. Accordingly, in various embodiments, the thickness of the shielding layer 505 can be tuned to achieve a shielding effect at a particular frequency depending on the intended use of the structured article.

Figure 7:
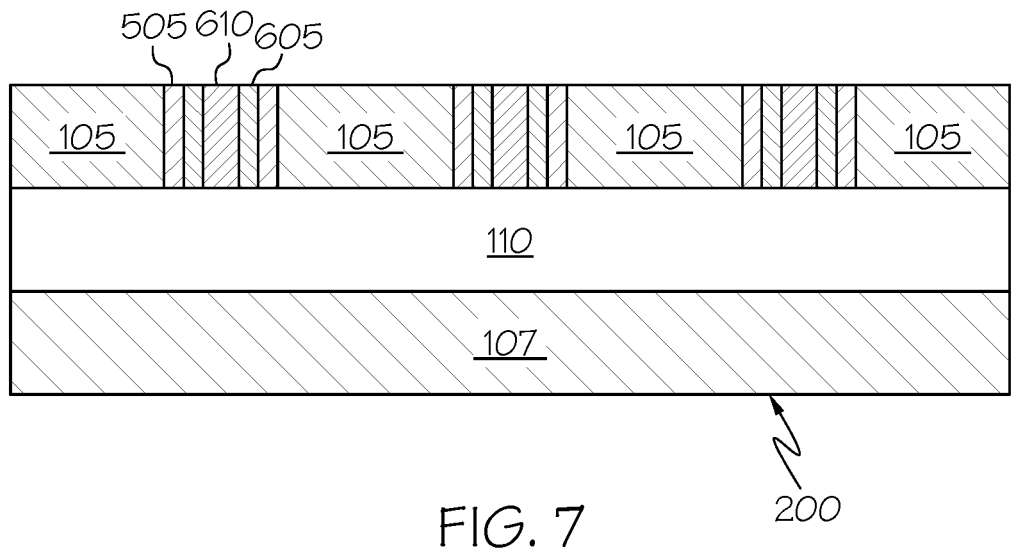
FIG. 7 is a cross-sectional schematic view of an embodiment of a reconstituted wafer- and/or panel-level package having a shielding layer and a passivation layer deposited along the sidewalls of the cavities in accordance with one or more embodiments shown and described herein.

As shown in FIG. 5, in various embodiments, the shielding layer 505 may be disposed along the sidewall 305 and the floor 310 of each of the cavities 425. This arrangement may enable encapsulation of the chip to be positioned within the cavity 425. However, it is also contemplated that the shielding layer 505 may be removed from the floor 310 of the cavity 425, or the floor of the cavity may be substantially free or free of the shielding layer, such as depicted in FIG. 7, and/or deposited along the top surface of the glass substrate, such as depicted in FIG. 8, as will be discussed in greater detail below.

Figure 6:
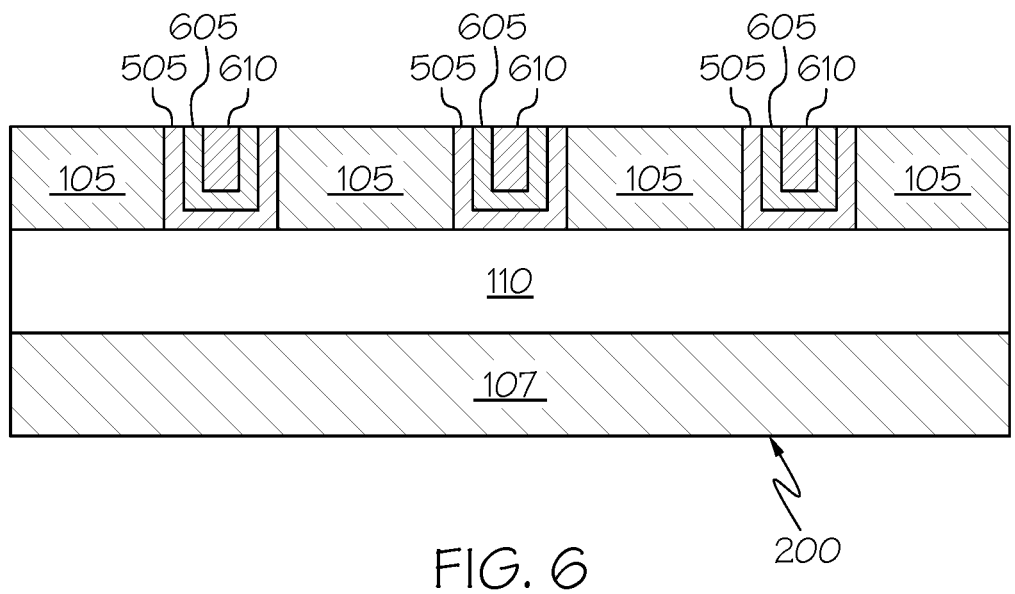
FIG. 6 is a cross-sectional schematic view of an embodiment of a reconstituted wafer- and/or panel-level package having a shielding layer and a passivation layer deposited along the sidewalls and floors of the cavities in accordance with one or more embodiments shown and described herein.

Turning now to FIG. 6, an embodiment in which a passivation layer 605 is deposited within the cavities 425 of a reconstituted wafer- and/or panel-level package 200 is shown. In embodiments including a passivation layer 605, the passivation layer 605 may reduce or even prevent conductive interference between the microelectronic component 610 and the shielding layer 505. In FIG. 6, the passivation layer 605 is deposited within the cavities 425 such that the shielding layer 505 is between the passivation layer 605 and the glass substrate. For example, the passivation layer 605 can be deposited following the deposition of the shielding layer 505.

The passivation layer 605 can be made of any suitable material and according to any suitable method. For example, the passivation layer 605 can be made of any electrically insulating material. By way of example and not limitation, the passivation layer 605 may be made from electrically insulating polymers or $SiO_2$. The passivation layer 605 has a thickness that varies depending on the particular application. In particular, the thickness of the passivation layer 605 may be from about 0.1 μm to about 50 μm. For example, a polymer passivation layer 605 may be from about 5 μm to about 50 μm, while a $SiO_2$ passivation layer 605 may be from about 0.1 μm to about 1 μm. In embodiments, the thickness of the passivation layer 605 can vary along the depth of the cavity 425, such as in embodiments in which the sidewall is non-vertical relative to the floor of the cavity 425. In other words, in some embodiments, the passivation layer 605 can have a thickness near a top of the cavity 425 that is greater than a thickness of the passivation layer 605 near the floor of the cavity 425.

The method of depositing the passivation layer 605 may depend on the particular embodiment and the material selected. The passivation layer 605 can provide or enhance electrical stability by protecting the surface. In particular, in some embodiments, the passivation layer 605 reduces, or even prevents, degradation processes that may occur in the presence of high electric fields. For example, in the embodiment depicted in FIG. 6, the passivation layer 605 can be deposited using the same or a similar technique used to form the shielding layer 505 (e.g., CVD, PVD, sputtering, or the like). In the embodiment depicted in FIG. 6, the passivation layer 605 is deposited within the cavities 425 before the microelectronic components 610 are placed within the cavities. However, in the embodiment depicted in FIG. 7, the passivation layer 605 may be directly filled between the microelectronic component 610 and the shielding layer 505 and, thus, deposited after the microelectronic components 610 are placed within the cavities.

For example, according to some embodiments, the shielding layer 505 may be deposited along the sidewalls 305 and the floor 310 of the cavities 425 using a chemical vapor deposition (CVD), physical vapor deposition (PVD), or sputtering technique. Following deposition, the shielding layer 505 may optionally be removed from the floor 310 of the cavities 425 using etching or other suitable material removal techniques. Alternatively, the shielding layer 505 may not be deposited on the floor 310 of the cavities 425, such as through the use of a mask during deposition of the shielding layer 505. In embodiments, the shielding layer 505 provides vertical shielding of individual microelectronic components 610, and can enable optical transmission through the glass core layer 110, making the reconstituted wafer- and/or panel-level package 200 suitable for use in optical applications. In contrast, the embodiment depicted in FIG. 6 provides vertical and tangential shielding of individual microelectronic components 610.

In some embodiments, the microelectronic component 610 is placed within the shielded cavity, and the passivation layer 605 can be directly filled between the microelectronic component 610 and the shielding layer 505. In such embodiments, the sidewalls 305 of the cavities 425 may have an angle greater than 90° relative to the floor 310 of the cavities 425 to enable the passivation layer 605 to be deposited between the microelectronic component 610 and the shielding layer 505. In other words, in embodiments in which the passivation layer 605 is directly filled between the microelectronic component 610 and the shielding layer 505, each cavity 425 may have a width greater at the top surface of the glass substrate than a width along the floor 310 of the cavity 425. However, the particular angle of the sidewall relative to the floor of the cavity may vary depending on the method used to fill the passivation layer 605 between the microelectronic component 610 and the shielding layer 505. In embodiments in which direct filling of the passivation layer 605 is utilized, the passivation layer 605 provides passivation as well as chip-fixing functions to the package. Accordingly, it is contemplated that the particular location of both the shielding layer 505 and the passivation layer 605 as well as the order of depositing the passivation layer 605 and the microelectronic component 610 may vary depending on the particular embodiment.

As shown in FIG. 8, in some embodiments, the shielding layer 505 can be deposited on the surface of the glass cladding layer 105 between adjacent cavities 425 in addition to being deposited within the cavities 425. In such embodiments, the shielding layer 505 provides vertical and lateral shielding of individual microelectronic components 610.

In FIG. 8, although the shielding layer 505 is deposited on the surface of the glass cladding layer between cavities 425, the optional passivation layer 605 is deposited only within the cavities 425. This arrangement enables increased contact between the shielding layer 505 and the RDL, which may improve cooling efficiency, as will be discussed in greater detail with respect to FIG. 10.

Figure 9:
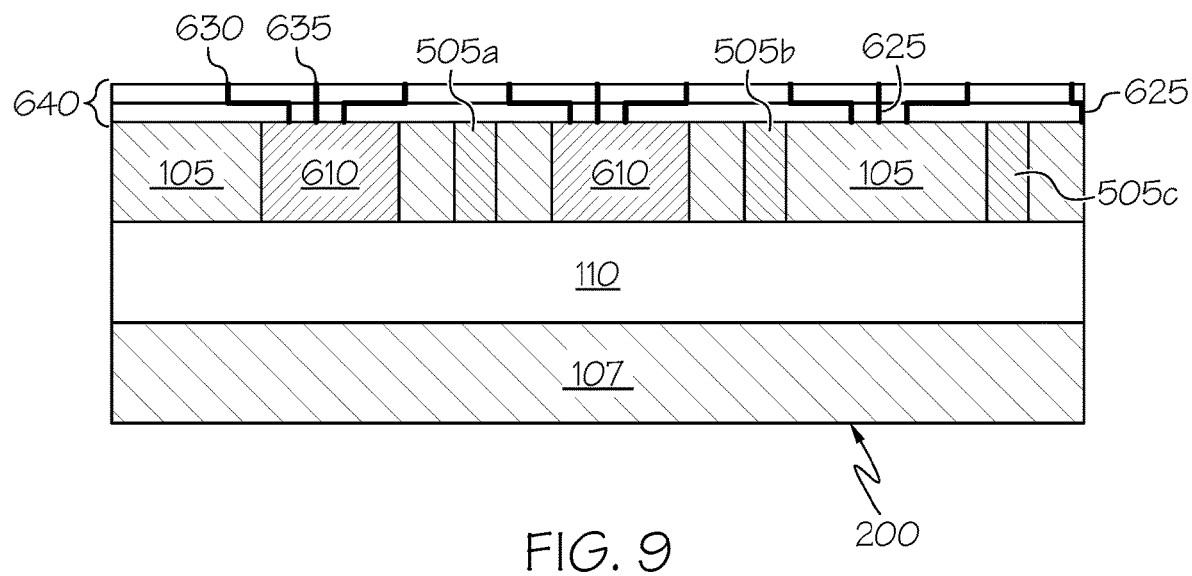
FIG. 9 is a cross-sectional schematic view of an embodiment of a reconstituted wafer- and/or panel-level package having a shielding layer deposited within trenches formed in the glass cladding layer in accordance with one or more embodiments shown and described herein.

Turning now to FIG. 9, an embodiment including chip-to-chip, chip-to-line, and line-to-line shielding is shown. In FIG. 9, an RDL 640 is positioned on the surface of the reconstituted wafer- and/or panel-level package 200. In some embodiments, the RDL 640 covers the surface of the glass substrate 100 including the cladding layer 105 and the microelectronic components 610. The RDL 640 can include a single physical layer or multiple separate layers that combine to form the RDL 640, as shown in FIG. 9. In the embodiment shown in FIG. 9, the RDL 640 includes leads 630 and 635 that pass from the microelectronic components 610 to the upper surface of the RDL 640 as well as lines 625 that extend through the RDL 640.

FIG. 9 depicts the shielding layer 505 deposited within trenches formed in the cladding layer 105. In such embodiments, trenches (e.g., a long channel having a substantially longer length than width) may be formed within the cladding layer 105, such as through etching or photomachining the cladding layer 105 as described hereinabove, and the trenches may be filled with the material forming the shielding layer 505. Accordingly, when the RDL 640 is deposited on top of the reconstituted wafer- and/or panel-level package 200, the shielding layer 505 may provide chip-to-chip shielding (when the shielding layer 505a is provided between two microelectronic components 610), chip-to-line shielding (when the shielding layer 505b is provided between a microelectronic component 610 and a line 625 provided with the RDL 640), and/or line-to-line shielding (when the shielding layer 505c is provided between two lines 625 in the RDL 640).

In some embodiments, the shaped article can be used as an integrated circuit package, and in particular, as a glass fan-out. For example, microelectronic components 610, which can be diced from an underlying wafer, are placed in the cavities 425 to form a reconstituted wafer- and/or panel-level package 200, as shown in FIGS. 6-10. The cavities 425 can be configured to receive any suitable microelectronic components 610. In some embodiments, the microelectronic components 610 are silicon based IC chips, antennas, sensors, or the like.

Following coating with the shielding layer and the optional passivation layer, the cavities 425 are each substantially the same size (width (x), length (y), and/or depth (z)) as the microelectronic components 610 to allow an exact fit of a microelectronic component 610 in each corresponding cavity 425. As mentioned above, it can be desirable for the microelectronic components 610 to be flush with the top surface of the glass cladding layer 105 and/or the glass cladding layer 107. Nevertheless, there may be situations where the top of the microelectronic components 610 may not be perfectly flush with the glass cladding layer 105 and/or the glass cladding layer 107. This may be acceptable provided the resulting reconstituted substrate is capable of being further processed to produce the final package.

The microelectronic components 610 can generally vary 1-2 microns in size. In some embodiments, the width (x), length (y), and/or depth (z) of each cavity 425 including the shielding layer and optional passivation layer varies by no more than 20 microns, no more than 10 microns, no more than 5 microns, or no more than 4 microns relative to: (a) a target size of the dimension(s) of the cavities 425 including the shielding layer and the optional passivation layer, (b) the actual size of the corresponding dimension(s) of the microelectronic component 610, and/or (c) the target size of the corresponding dimension(s) of the microelectronic components 610. For example, the width (x), length (y), and/or depth (z) of each cavity 425 including the shielding layer and optional passivation layer can be no more than 20 microns larger, no more than 10 microns larger, no more than 5 microns larger, or no more than 4 microns larger than: (a) a target size of the dimension(s) of the cavities 425 including the shielding layer and the optional passivation layer, (b) the actual size of the corresponding dimension(s) of the microelectronic component 610, and/or (c) the target size of the corresponding dimension(s) of the microelectronic components 610. The laminate structure of the glass substrate 100 can provide particularly precise control of the depth of the cavities 425 compared to conventional substrates.

Figure 10:
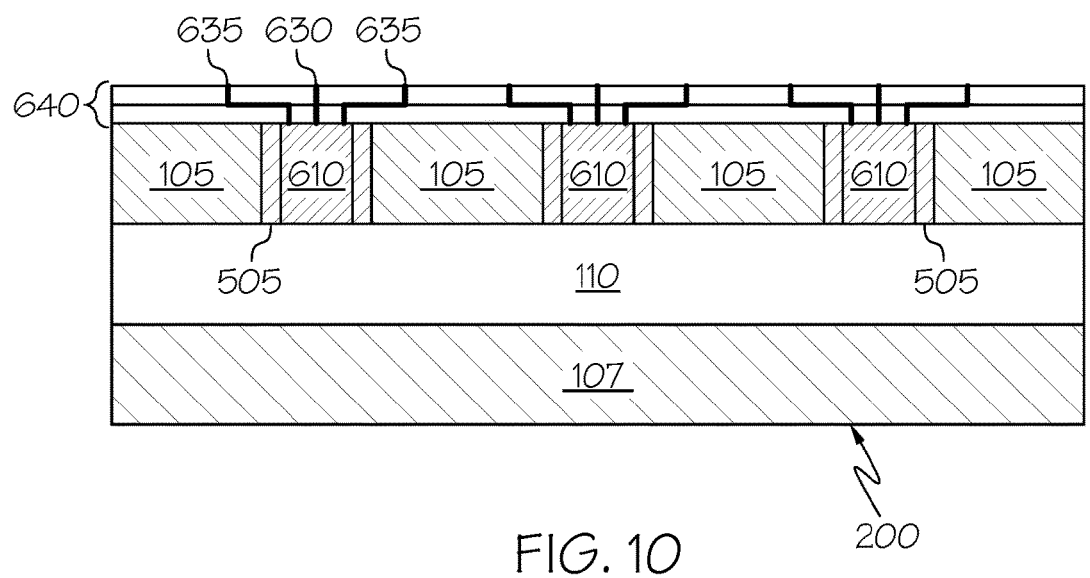
FIG. 10 is a cross-sectional schematic view of a reconstituted wafer- and/or panel-level package having a shielding layer deposited along the sidewalls of the cavities with a redistribution layer positioned on the glass substrate and the microelectronic components in accordance with one or more embodiments shown and described herein.

FIG. 10 is a cross-sectional schematic view of another embodiment of a reconstituted wafer- and/or panel-level package 200 with an RDL 640 positioned on the surface thereof. In some embodiments, the RDL 640 covers the surface of the glass substrate 100 including the cladding layer 105 and the microelectronic components 610. The RDL 640 can include a single physical layer or multiple separate layers that combine to form the RDL 640. In the embodiment shown in FIG. 10, the RDL 640 includes leads 630 and 635 that pass from the microelectronic components 610 to the upper surface of the RDL 640. The leads 630 can be within the dimensions of the microelectronic components 610 and the leads 635 can extend outside the dimensions of the microelectronic components 610.

In various embodiments, the shielding layer 505 provides a thermal cooling effect in addition to EMI shielding functionality. In particular, the shielding layer 505 can be electrically and thermally connected to either the RDL 640 or the ground plane through adjacent shielding layers, providing an increased thermal conduction contact area between the microelectronic components 610 and the grounding plane of the RDL 640 as compared to embodiments in which the microelectronic component 610 is not in contact with the shielding layer 505. In other words, as shown in FIG. 10, the electrical and thermal connection between the shielding layer 505 and the RDL 640 effectively increase the contact area between the microelectronic component 610 within the cavity and the RDL 640, enabling more effective heat dissipation away from the microelectronic component 610. Some embodiments, such as the embodiment depicted in FIG. 9, are particularly well suited for applications requiring a well-defined signal performance, such as microstrip or stripline transmission lines because of the electrical and thermal connection between the shielding layer 505 and the RDL 640.

In various embodiments, a reconstituted wafer- and/or panel-level package is described as comprising a glass substrate comprising a plurality of cavities and a microelectronic component positioned in each one of the plurality of cavities in the glass substrate. It should be noted that such a reconstituted wafer- and/or panel-level package may have additional cavities with or without microelectronic components positioned therein. For example, in some embodiments, a reconstituted wafer- and/or panel-level package includes a plurality of cavities with a microelectronic component positioned in each one of the plurality of cavities and one or more additional cavities that are free of a microelectronic component positioned therein. In other embodiments, a reconstituted wafer- and/or panel-level package includes a plurality of cavities with a microelectronic component positioned in each one of the plurality of cavities and is free of additional cavities.

Terminology and Interpretative Norms

The term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

The terms "glass" and "glass composition" encompass both glass materials and glass-ceramic materials, as both classes of materials are commonly understood. Likewise, the term "glass structure" encompasses structures comprising glass. The term "reconstituted wafer- and/or panel-level package" encompasses any size of reconstituted substrate package including wafer level packages and panel level packages.

Numerical values, including endpoints of ranges, can be expressed herein as approximations preceded by the term "about," "approximately," or the like. In such cases, other embodiments include the particular numerical values. Regardless of whether a numerical value is expressed as an approximation, two embodiments are included in this disclosure: one expressed as an approximation, and another not expressed as an approximation. It will be further understood that an endpoint of each range is significant both in relation to another endpoint, and independently of another endpoint.

The term "surface roughness" means Ra surface roughness determined as described in ISO 25178, Geometric Product Specifications (GPS)—Surface texture: areal, filtered at 25 μm unless otherwise indicated. The surface roughness values reported herein were obtained using a Keyence confocal microscope.

The term "formed from" can mean one or more of comprises, consists essentially of, or consists of. For example, a component that is formed from a particular material can comprise the particular material, consist essentially of the particular material, or consist of the particular material.

Directional terms as used herein—for example up, down, right, left, front, back, top, bottom, vertical, horizontal—are made only with reference to the figures as drawn and are not intended to imply absolute orientation unless otherwise expressly stated.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any embodiment, feature, or combination of features described or illustrated in this document. This is true even if only a single embodiment of the feature or combination of features is illustrated and described in this document.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A structured glass article comprising:
   a glass substrate comprising a glass cladding fused to a glass core layer;
   a cavity formed in the glass substrate, the cavity having a floor and a side wall with at least a portion of the side wall defined by the glass cladding; and
   a shielding layer disposed within the cavity.

2. The structured glass article according to claim 1, wherein the shielding layer is disposed on at least one of the floor or the side wall of the cavity.

3. The structured glass article according to claim 2, wherein the shielding layer is disposed on the floor and the side wall of the cavity.

4. The structured glass article according to claim 1, further comprising a passivation layer disposed within the cavity, wherein the shielding layer is positioned between the passivation layer and the glass substrate.

5. The structured glass article according to claim 4, wherein the passivation layer comprises an electrically insulating material.

6. The structured glass article according to claim 5, wherein the electrically insulating material comprises $SiO_2$.

7. The structured glass article according to claim 1, wherein the side wall of the cavity is substantially perpendicular to the floor of the cavity.

8. The structured glass article according to claim 1, wherein the glass core forms the floor of the cavity.

9. The structured glass article according to claim 1, wherein the shielding layer comprises one or more of a layer of graphene, a layer of nickel, a layer of iron, a layer of titanium, a layer of copper, a layer of aluminum, or a combination thereof.

10. The structured glass article according to claim 1, wherein the shielding layer has a thickness of from 3 to 5 times a maximum skin depth $\delta_{max}$ of the shielding layer.

11. An integrated circuit package comprising:
    the structured glass article according to claim 1; and
    an integrated circuit chip disposed within the cavity.

12. An optical device comprising the structured glass article according to claim 1.

13. A microfluidic device comprising the structured glass article according to claim 1.

14. A method for forming a glass fan-out package, the method comprising:

depositing a shielding layer within a cavity in a glass substrate comprising a glass cladding layer fused to a glass core layer, the cavity having a floor and a side wall with at least a portion of the side wall defined by the glass cladding layer; and depositing a microelectronic component within the cavity.

15. The method of claim 14, further comprising:

depositing a passivation layer within the cavity after depositing the shielding layer.

16. The method of claim 15, further comprising:

removing the shielding layer along a floor of the cavity prior to depositing the passivation layer, wherein depositing the passivation layer comprises filling a portion of the cavity between the microelectronic component and the shielding layer.

17. The method of claim 15, wherein depositing the passivation layer comprises depositing the passivation layer prior to depositing the microelectronic component within the cavity.

18. The method of claim 15, further comprising:

removing the shielding layer and the passivation layer along a floor of the cavity.

19. The method of claim 14, wherein depositing the shielding layer comprises depositing the shielding layer on the glass cladding layer between the cavity and at least one adjacent cavity.

20. A structured glass article comprising:

a glass substrate comprising a glass cladding fused to a glass core layer;

a cavity formed in the glass substrate; and a shielding layer disposed within the cavity, the shielding layer having a thickness of from 3 to 5 times a maximum skin depth $\delta_{max}$ of the shielding layer.

* * * * *